US010252618B2

(12) United States Patent
Zhou et al.

(10) Patent No.: US 10,252,618 B2
(45) Date of Patent: Apr. 9, 2019

(54) BACKUP ELECTRICAL SUPPLY FOR MAIN CAPACITOR DISCHARGE

(71) Applicant: Ford Global Technologies, LLC, Dearborn, MI (US)

(72) Inventors: Yan Zhou, Canton, MI (US); Shuitao Yang, Dearborn Heights, MI (US); Lihua Chen, Northville, MI (US); Yuqing Tang, Northville, MI (US); Hongjie Wu, Canton, MI (US)

(73) Assignee: FORD GLOBAL TECHNOLOGIES, LLC, Dearborn, MI (US)

( * ) Notice: Subject to any disclaimer, the term of this patent is extended or adjusted under 35 U.S.C. 154(b) by 0 days.

(21) Appl. No.: 15/257,303

(22) Filed: Sep. 6, 2016

(65) Prior Publication Data

US 2018/0065489 A1  Mar. 8, 2018

(51) Int. Cl.
| | |
|---|---|
| *B60L 3/00* | (2006.01) |
| *B60R 16/03* | (2006.01) |
| *H02M 3/335* | (2006.01) |
| *H02P 27/08* | (2006.01) |
| *B60L 11/00* | (2006.01) |
| *H02M 7/5387* | (2007.01) |
| *H02J 9/06* | (2006.01) |
| *B60L 11/18* | (2006.01) |
| *B60L 15/00* | (2006.01) |
| *H03K 17/691* | (2006.01) |

(52) U.S. Cl.
CPC ............. *B60L 3/0092* (2013.01); *B60L 3/003* (2013.01); *B60L 11/005* (2013.01); *B60L 11/1868* (2013.01); *B60L 15/007* (2013.01); *B60R 16/03* (2013.01); *H02J 9/06* (2013.01); *H02M 3/33523* (2013.01); *H02M 7/5387* (2013.01); *B60L 2210/12* (2013.01); *H02P 27/08* (2013.01); *H03K 17/691* (2013.01); *H03K 2217/0081* (2013.01)

(58) Field of Classification Search
CPC .. H02P 6/00; H02P 6/14; H02P 27/08; H02M 1/00; H02M 3/00; H02M 3/33523; B60L 1/00; B60L 2210/00; B60L 3/0092; B60L 11/005; H02J 7/00; B60R 16/03
See application file for complete search history.

(56) References Cited

U.S. PATENT DOCUMENTS

| | | | |
|---|---|---|---|
| 7,956,488 | B2 | 6/2011 | Kobayashi et al. |
| 8,994,208 | B2 | 3/2015 | Huang |
| 9,296,589 | B2 | 3/2016 | Marvin |

(Continued)

FOREIGN PATENT DOCUMENTS

FR         2996383 A1 *  4/2014  ........ H02M 3/33584

*Primary Examiner* — Eduardo Colon Santana
*Assistant Examiner* — Said Bouziane
(74) *Attorney, Agent, or Firm* — David B. Kelley; Brooks Kushman P.C.

(57) ABSTRACT

A vehicle may include an electric drive system including switches having gates configured to control the switches. The vehicle may include a galvanic isolation coupling having a primary side electrically connected with an input power source and a secondary side electrically connected with a gate driver circuit. The gat driver circuit has a controller configured to actuate the gates and a power supply circuit electrically connected to the controller to provide backup power. The galvanic isolation coupling may be a flyback converter.

7 Claims, 5 Drawing Sheets

(56) References Cited

U.S. PATENT DOCUMENTS

| | | | |
|---|---|---|---|
| 2004/0008530 A1* | 1/2004 | Kitahata | H02M 5/458 363/131 |
| 2009/0174353 A1* | 7/2009 | Nakamura | B60L 11/1868 318/400.27 |
| 2012/0235613 A1* | 9/2012 | Huang | B60L 3/0092 318/400.26 |
| 2014/0095005 A1* | 4/2014 | Kanzaki | B60L 11/1803 701/22 |
| 2015/0332838 A1* | 11/2015 | Blanke | H01F 27/2804 336/170 |

* cited by examiner

BACKUP ELECTRICAL SUPPLY FOR MAIN CAPACITOR DISCHARGE

TECHNICAL FIELD

The present disclosure relates to inverters for electric machines.

BACKGROUND

A traction inverter for an electric machine may include a high-voltage capacitor connected to positive and negative rails of the inverter to maintain a voltage potential across switches of the inverter. During an interruption, the alternating current lead from the inverter switches to the motor may become disconnected. Additionally, the gate driver controller may lose power. In either situation, the high-voltage capacitor may maintain high voltage levels.

SUMMARY

A vehicle may include an electric drive system including switches having gates configured to control the switches. The vehicle may include a galvanic isolation coupling having a primary side electrically connected with an input power source and a secondary side electrically connected with a gate driver circuit. The gate driver circuit has a controller configured to actuate the gates and a power supply circuit electrically connected to the controller to provide backup power. The galvanic isolation coupling may be a flyback converter.

A vehicle power system may include a motor. The vehicle power system may include a controller programmed to, in response to interruption of power from an inverter to the motor, continue switching the inverter to discharge stored energy from a high-voltage capacitor of the inverter, that is electromagnetically coupled via a coupling to rails and a gate driver of the inverter, such that electrical losses associated with the switching dissipates the stored energy. The coupling may include a flyback converter.

A vehicle power system may include a motor. The vehicle power system may include a controller programmed to, in response to interruption of power to a gate driver of the inverter, continue switching the inverter to discharge stored energy from a high-voltage capacitor of the inverter, that is electromagnetically coupled via a coupling to rails and a gate driver of the inverter, such that inductive losses associated with the motor dissipates the stored energy. The coupling may include a flyback converter.

DETAILED DESCRIPTION

Embodiments of the present disclosure are described herein. It is to be understood, however, that the disclosed embodiments are merely examples and other embodiments may take various and alternative forms. The figures are not necessarily to scale; some features could be exaggerated or minimized to show details of particular components. Therefore, specific structural and functional details disclosed herein are not to be interpreted as limiting, but merely as a representative basis for teaching one skilled in the art to variously employ the present invention. As those of ordinary skill in the art will understand, various features illustrated and described with reference to any one of the figures may be combined with features illustrated in one or more other figures to produce embodiments that are not explicitly illustrated or described. The combinations of features illustrated provide representative embodiments for typical applications. Various combinations and modifications of the features consistent with the teachings of this disclosure, however, could be desired for particular applications or implementations.

Figure 1:
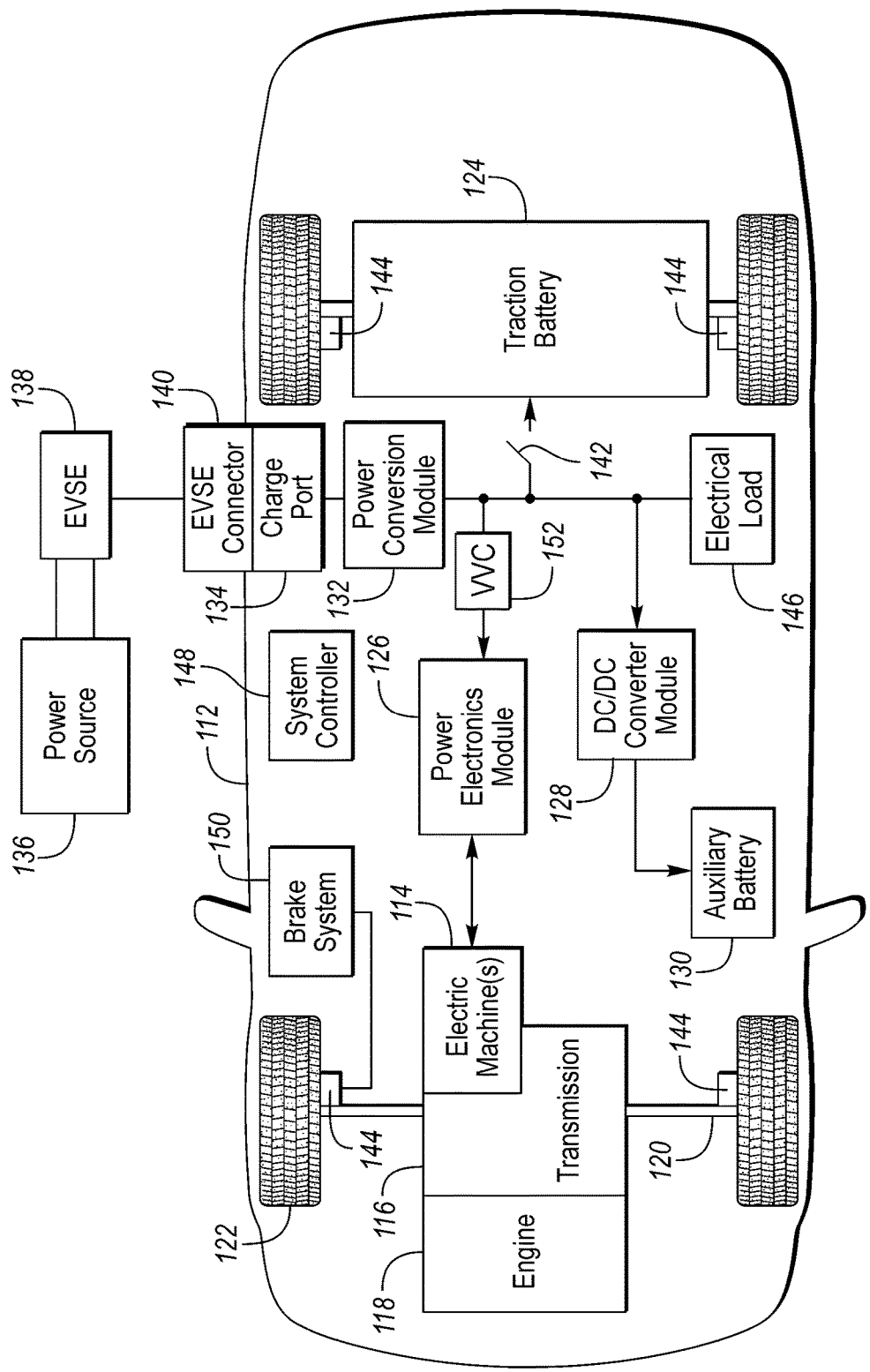
FIG. 1 is an overview of a vehicle having an inverter and electric motor.

FIG. 1 depicts an electrified vehicle 112 that may be referred to as a plug-in hybrid-electric vehicle (PHEV). A plug-in hybrid-electric vehicle 112 may comprise one or more electric machines 114 mechanically coupled to a hybrid transmission 116. The electric machines 114 may be capable of operating as a motor or a generator. In addition, the hybrid transmission 116 is mechanically coupled to an engine 118. The hybrid transmission 116 is also mechanically coupled to a drive shaft 120 that is mechanically coupled to the wheels 122. The electric machines 114 can provide propulsion and deceleration capability when the engine 118 is turned on or off. The electric machines 114 may also act as generators and can provide fuel economy benefits by recovering energy that would normally be lost as heat in a friction braking system. The electric machines 114 may also reduce vehicle emissions by allowing the engine 118 to operate at more efficient speeds and allowing the hybrid-electric vehicle 112 to be operated in electric mode with the engine 118 off under certain conditions. An electrified vehicle 112 may also be a battery electric vehicle (BEV). In a BEV configuration, the engine 118 may not be present. In other configurations, the electrified vehicle 112 may be a full hybrid-electric vehicle (FHEV) without plug-in capability.

A traction battery or battery pack 124 stores energy that can be used by the electric machines 114. The vehicle battery pack 124 may provide a high voltage direct current (DC) output. The traction battery 124 may be electrically coupled to one or more power electronics modules 126. One or more contactors 142 may isolate the traction battery 124 from other components when opened and connect the traction battery 124 to other components when closed. The power electronics module 126 is also electrically coupled to the electric machines 114 and provides the ability to bi-directionally transfer energy between the traction battery 124 and the electric machines 114. For example, a traction battery 124 may provide a DC voltage while the electric machines 114 may operate with a three-phase alternating current (AC) to function. The power electronics module 126 may convert the DC voltage to a three-phase AC current to operate the electric machines 114. In a regenerative mode, the power electronics module 126 may convert the three-phase AC current from the electric machines 114 acting as generators to the DC voltage compatible with the traction battery 124.

The vehicle 112 may include a variable-voltage converter (VVC) 152 electrically coupled between the traction battery 124 and the power electronics module 126. The VVC 152 may be a DC/DC boost converter configured to increase or boost the voltage provided by the traction battery 124. By increasing the voltage, current requirements may be decreased leading to a reduction in wiring size for the power electronics module 126 and the electric machines 114. Further, the electric machines 114 may be operated with better efficiency and lower losses.

In addition to providing energy for propulsion, the traction battery 124 may provide energy for other vehicle electrical systems. The vehicle 112 may include a DC/DC converter module 128 that converts the high voltage DC output of the traction battery 124 to a low voltage DC supply that is compatible with low-voltage vehicle loads. An output of the DC/DC converter module 128 may be electrically coupled to an auxiliary battery 130 (e.g., 12V battery) for charging the auxiliary battery 130. The low-voltage systems may be electrically coupled to the auxiliary battery 130. One or more electrical loads 146 may be coupled to the high-voltage bus. The electrical loads 146 may have an associated controller that operates and controls the electrical loads 146 when appropriate. Examples of electrical loads 146 may be a fan, an electric heating element and/or an air-conditioning compressor.

The electrified vehicle 112 may be configured to recharge the traction battery 124 from an external power source 136. The external power source 136 may be a connection to an electrical outlet. The external power source 136 may be electrically coupled to a charger or electric vehicle supply equipment (EVSE) 138. The external power source 136 may be an electrical power distribution network or grid as provided by an electric utility company. The EVSE 138 may provide circuitry and controls to regulate and manage the transfer of energy between the power source 136 and the vehicle 112. The external power source 136 may provide DC or AC electric power to the EVSE 138. The EVSE 138 may have a charge connector 140 for plugging into a charge port 134 of the vehicle 112. The charge port 134 may be any type of port configured to transfer power from the EVSE 138 to the vehicle 112. The charge port 134 may be electrically coupled to a charger or on-board power conversion module 132. The power conversion module 132 may condition the power supplied from the EVSE 138 to provide the proper voltage and current levels to the traction battery 124. The power conversion module 132 may interface with the EVSE 138 to coordinate the delivery of power to the vehicle 112. The EVSE connector 140 may have pins that mate with corresponding recesses of the charge port 134. Alternatively, various components described as being electrically coupled or connected may transfer power using a wireless inductive coupling.

One or more wheel brakes 144 may be provided for decelerating the vehicle 112 and preventing motion of the vehicle 112. The wheel brakes 144 may be hydraulically actuated, electrically actuated, or some combination thereof. The wheel brakes 144 may be a part of a brake system 150. The brake system 150 may include other components to operate the wheel brakes 144. For simplicity, the figure depicts a single connection between the brake system 150 and one of the wheel brakes 144. A connection between the brake system 150 and the other wheel brakes 144 is implied. The brake system 150 may include a controller to monitor and coordinate the brake system 150. The brake system 150 may monitor the brake components and control the wheel brakes 144 for vehicle deceleration. The brake system 150 may respond to driver commands and may also operate autonomously to implement features such as stability control. The controller of the brake system 150 may implement a method of applying a requested brake force when requested by another controller or sub-function.

Electronic modules in the vehicle 112 may communicate via one or more vehicle networks. The vehicle network may include a plurality of channels for communication. One channel of the vehicle network may be a serial bus such as a Controller Area Network (CAN). One of the channels of the vehicle network may include an Ethernet network defined by Institute of Electrical and Electronics Engineers (IEEE) 802 family of standards. Additional channels of the vehicle network may include discrete connections between modules and may include power signals from the auxiliary battery 130. Different signals may be transferred over different channels of the vehicle network. For example, video signals may be transferred over a high-speed channel (e.g., Ethernet) while control signals may be transferred over CAN or discrete signals. The vehicle network may include any hardware and software components that aid in transferring signals and data between modules. The vehicle network is not shown in FIG. 1 but it may be implied that the vehicle network may connect to any electronic module that is present in the vehicle 112. A vehicle system controller (VSC) 148 may be present to coordinate the operation of the various components.

The power electronics module may include a plurality of switches to invert a direct current into an alternating current. The switches may be semiconductors. The switches may be any type of semiconducting switch. The switches may be insulated-gate bipolar transistors (IGBTs). The switches may have a gate, an emitter, and a collector. A potential may be created between the emitter and collector by a DC voltage source on rails or buses connected to each half-bridge of the inverter. The DC voltage source may be stored in a battery or generated on demand. The DC voltage source may be maintained by a high voltage capacitor. The high voltage capacitor may be configured to smooth oscillations in the source voltage and transients caused by switching.

The gates of the switches may be driven by a gate driver on a gate driver board. The gate driver board may be configured to receive power from multiple sources. One of those sources may be a 12-volt power supply. The 12-volt power supply may be a stepped down power supply from a higher voltage DC bus. The gate driver board may also receive power from the high-voltage capacitor. The high-voltage capacitor may be electromagnetically coupled to the gate driver board and power the gate. The electromagnetic coupling may be a galvanic isolation. Galvanic isolation may be embodied as a flyback converter, optical isolation, or other means of galvanic isolation.

In the event that one of the power supplies is lost, the gate driver board may automatically switch from one power supply to the other. The power supplies may both be configured to provide power to the gate driver board so that a loss of power switchover is not required.

With the aforementioned configuration, the gate driver board is configured to provide power to gates of the inverter when the high voltage capacitor has power. If dissipation of the energy stored in the capacitor is required, the gate driver board can continue to switch the gates of the inverter and dissipate the energy stored in the capacitor through the switches to the windings of the motor.

An electrical connection to the motor may be interrupted. During the interruption, the capacitor may be dissipated through switching of the gates. Toggling of the gates dissipates energy stored in the capacitor through heat. The heat generated may be withdrawn from the semiconducting switches through a heat sink. Increased switching frequency increases the energy dissipated through the switch. For this reason, the switching frequency may be increased during an interruption to dissipate the energy stored in the capacitor as quickly as possible. The switching frequency may also be set to ensure the switches do not exceed a threshold temperature. The controller may monitor the temperature of the switches and adjust the switching frequency to maintain a temperature below the threshold. In the event that the power connection between the inverter output and the motor is interrupted and the 12-volt gate driver board power supply is lost, the configuration can dissipate the power from the capacitor through toggling the gates of the switches with a gate driver board powered by energy stored in the capacitor.

Figure 2:
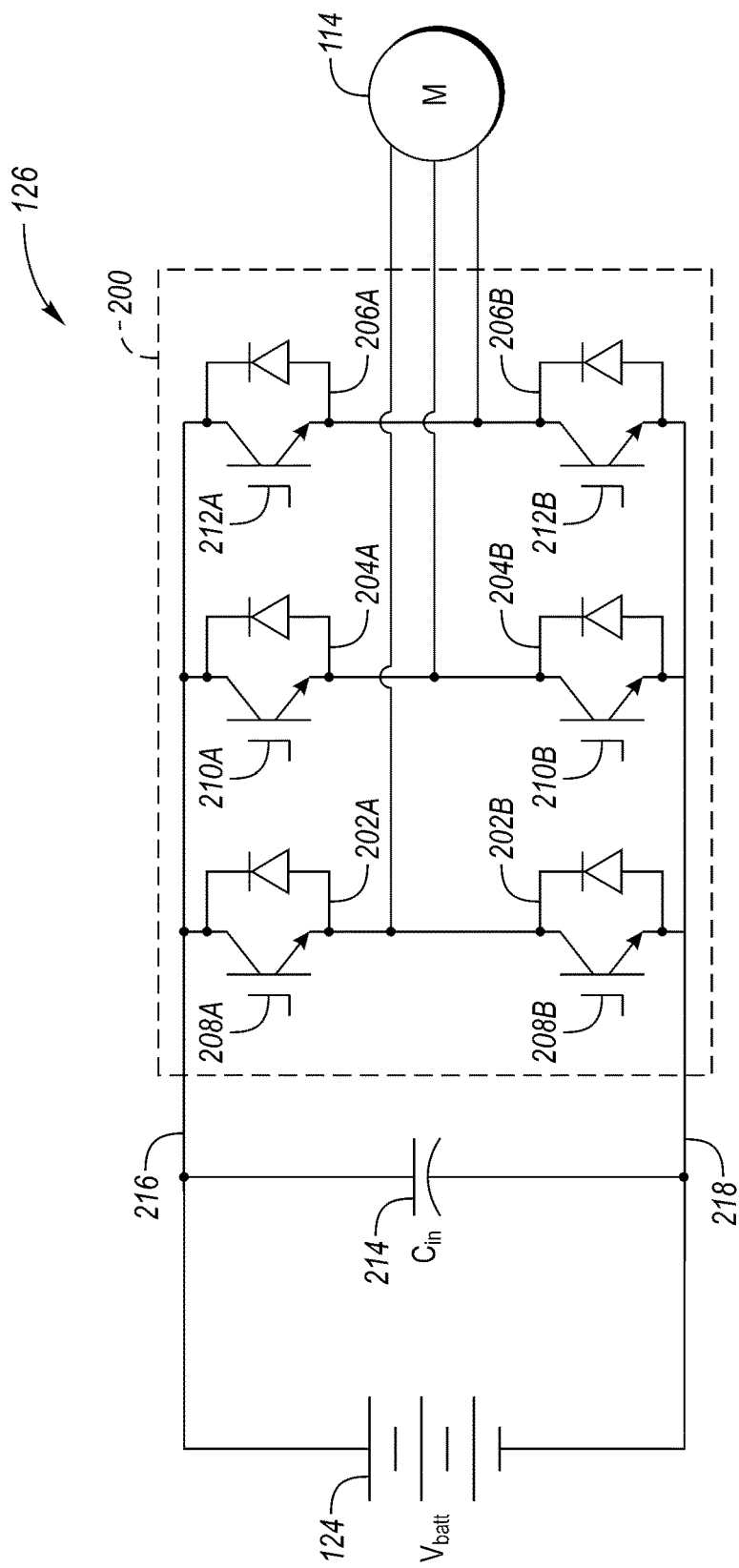
FIG. 2 is an inverter for a vehicle.

Now referring to FIG. 2, a power electronics module 126 is shown having a DC source $V_{batt}$ 124 powering an electric machine, M, 114. An inverter circuit 200 is shown having a plurality of switches 202A, 202B, 204A, 204B, 206A, 206B, used to generate an alternating signal for the motor 114. As shown, the inverter has a set of upper switches 202A, 204A, 206A and lower switches 202B, 204B, 206B. The switches are split into phase groups 202A-B, 204A-B, 206A-B. Each of the upper switches 204 provides a positive polarity for its relative phase. Each of the lower switches 206 provides a negative polarity for its relative phase. Each one of the switches is coupled with an anti-parallel diode to conduct reverse current when necessary. A controller controls each of the switches using a PWM signal driven by the gate driver to create a three-phase sinusoidal current for the stator windings. Although shown as a three-phase system, this disclosure contemplates machines operated on more or less than three phases.

The power electronics module 126 may also include a high-voltage, main capacitor 214 configured to smooth the voltage of the DC rails or buses 216, 218 and absorb switching related ripples. Each of the switches 202A, 202B, 204A, 204B, 206A, 206B has gates 208A, 208B, 210A, 210B, 212A, 212B configured to enable the flow of current. The charge remaining in the capacitor 214 may be required to be dissipated to a predetermined value. The charge remaining in capacitor 214 may be dissipated through the motor 114. The predetermined value may be well-below the normal operating voltage. The predetermined value may be 60 volts. The charge remaining in the capacitor 214 may be discharged through the motor 114 by switching the gates 208A, 208B, 210A, 210B, 212A, 212B. The gate switching may dissipate the energy stored in the capacitor 214 as heat and nominally rotate the motor. During an interruption of power between the inverter 200 and motor 114, the capacitor 214 may remain charged. The capacitor 214 may be dissipated through switching losses associated with the switches 202A, 202B, 204A, 204B, 206A, 206B. A gate driver board 232 may increases the switching frequency of the switches 202A, 202B, 204A, 204B, 206A to rapidly dissipate stored energy.

Figure 3:
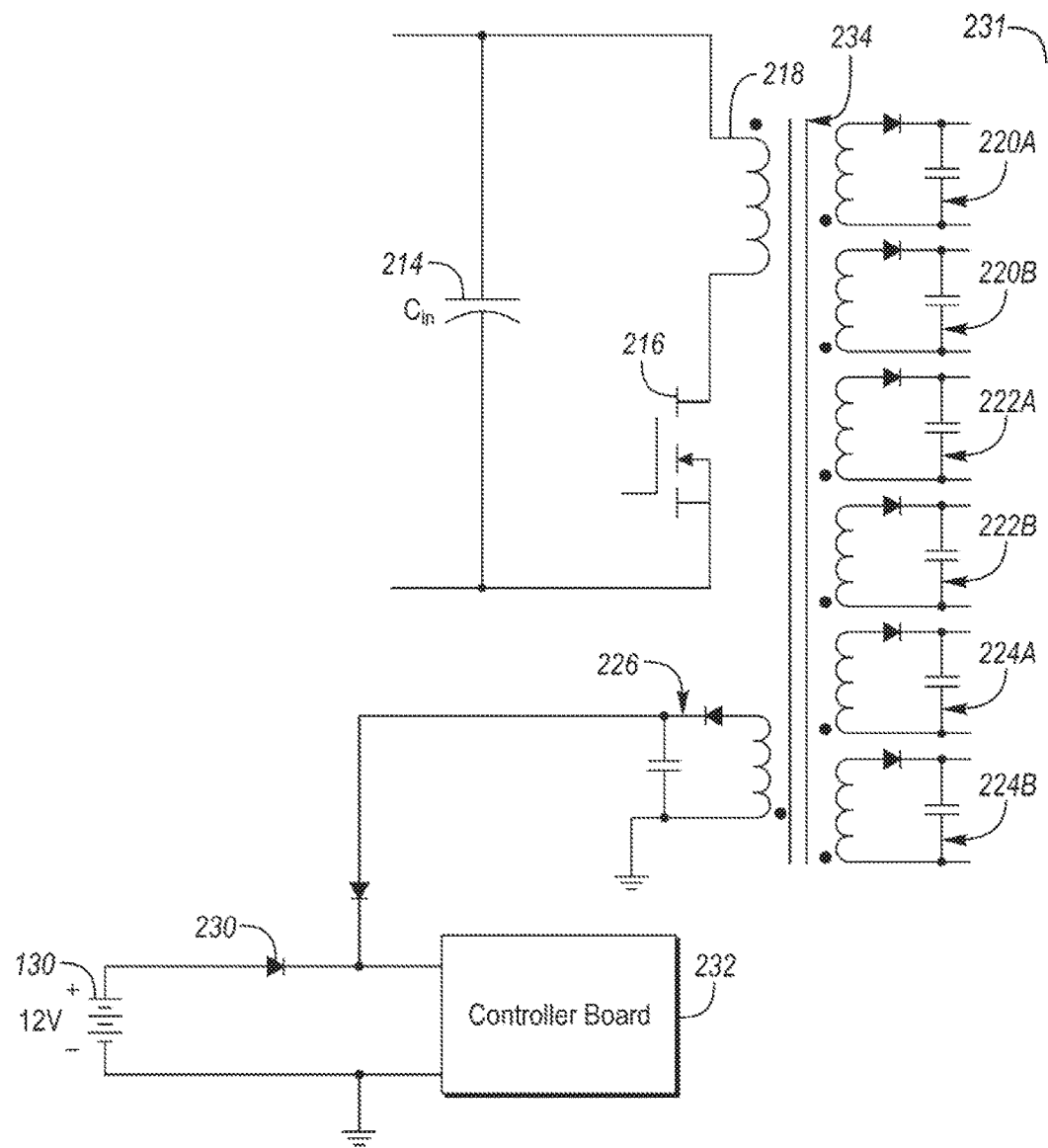
FIG. 3 is a galvanic isolation and voltage converter for a gate driver and a controller board.

Now referring to FIG. 3, a circuit configuration for a gate driver power supply 220A, 220B, 222A, 222B, 224A, 224B and a gate controller 232 is shown. A driver circuit 231 is shown. The capacitor 214 may be configured to power the primary side winding 218 of a galvanic coupling 234. The primary side 218 may include a switch for controlling output power across the coupling 234. The coupling 234 may be configured as a flyback converter. The coupling may have a plurality of secondary side windings 220A, 220B, 222A, 222B, 224A, 224B, 226. The second side windings 220A, 220B, 222A, 222B, 224A, 224B, 226 may be configured to tap the primary side winding 218. One of the secondary side windings 226, a controller driver, may be configured to provide backup or auxiliary power to the controller board 232. The controller board 232 may be powered by multiple sources. The controller board 232 may be configured with additional power input from the 12-volt auxiliary battery 130. A diode 230 may be used to ensure the 12-volt auxiliary battery is not back fed. The controller board 232 may provide input to the gate driver board. Therefore, the controller board is capable of providing power to the gate driver board when the capacitor 214 is charged. In the event that the auxiliary battery 130 is disconnected from the controller board 232, the controller board can still provide input to the gate controller board with power from the capacitor 214.

During an interruption of the electrical current between the inverter output and the motor, the gate controller 232 may be programmed to continue switching the electronic switches until a voltage of the stored energy is dissipated below 60 volts. The gate controller 232 may be further programmed to increase a switching frequency of the switches to improve the stored energy dissipation. The switching frequency may be increased above the switching frequency at the time the inverter interruption occurs. Meaning, the inverter may be switching the switches under a PWM scheme at a given frequency. This frequency may be the inverter interruption frequency. The switching frequency may be increased beyond the inverter interruption frequency to increase switching losses. The switching frequency may be increased to a maximum switching frequency of the switches. The switch manufacturer may specify the maximum switching frequency thresholds, which may vary between manufacturers and switches used. The controller may be programmed to increase the switching frequency to a maximum switching frequency and then decrease the switching frequency to ensure that maximum temperature limits of the switches are not exceeded. A temperature feedback loop may be created with the controller to ensure that the temperature limits are not exceeded. In another embodiment, the controller may be programmed to exceed temperature limits to ensure that the capacitor is discharged. In this embodiment, the switches may reach a known failure mode.

Figure 4:
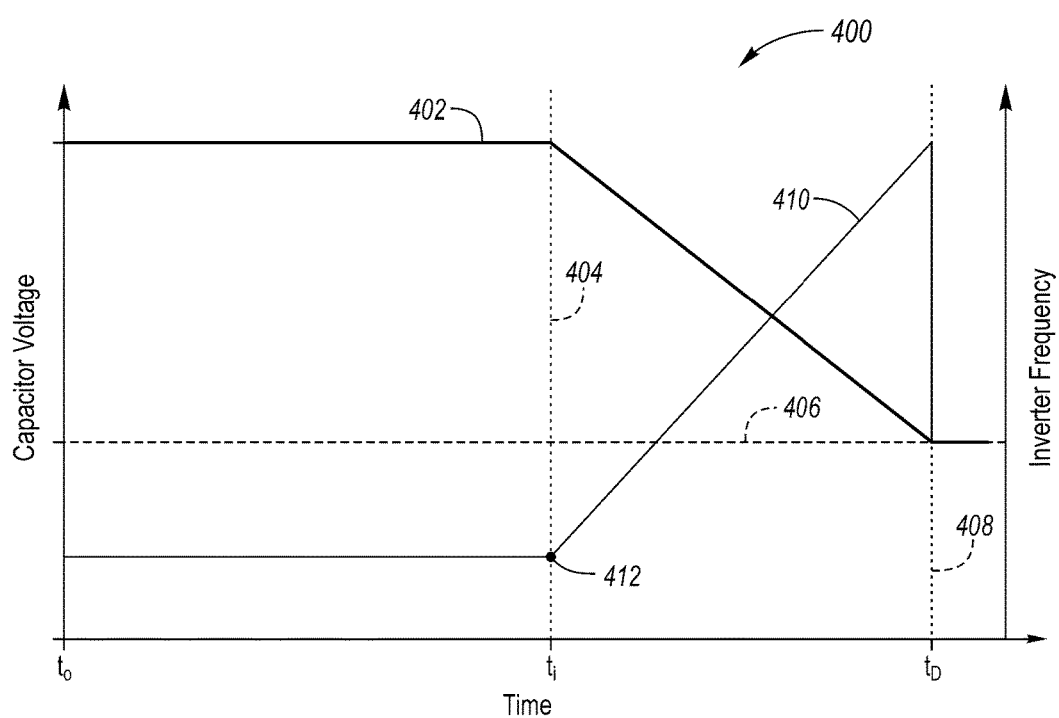
FIG. 4 is a graph depicting a reduction in the voltage of a capacitor.

Now referring to FIG. 4, a graph 400 is shown. The graph 400 discloses the capacitor voltage 402 and the inverter switching frequency 410 behavior before and after a shutdown event at $t_i$ 404. At $t_o$ the capacitor voltage 402 is large enough to drive the motor with an alternating current created by the inverter. At $t_i$ 404 a shutdown event or power interruption event occurs. The controller may continue to operate the switches to reduce the energy stored in the capacitor until a predetermined threshold 406 is reached at $t_d$ 408. The controller may increase the switching frequency 410 after the inverter interruption event from the inverter interruption frequency at 412. When the capacitor voltage is dissipated at $t_d$, the inverter switching frequency drops to zero. Although shown as a linear function, the switching frequency may be adjusted as a step input or any other type of change after the interruption. The predetermined threshold may be 60 volts.

Figure 5:
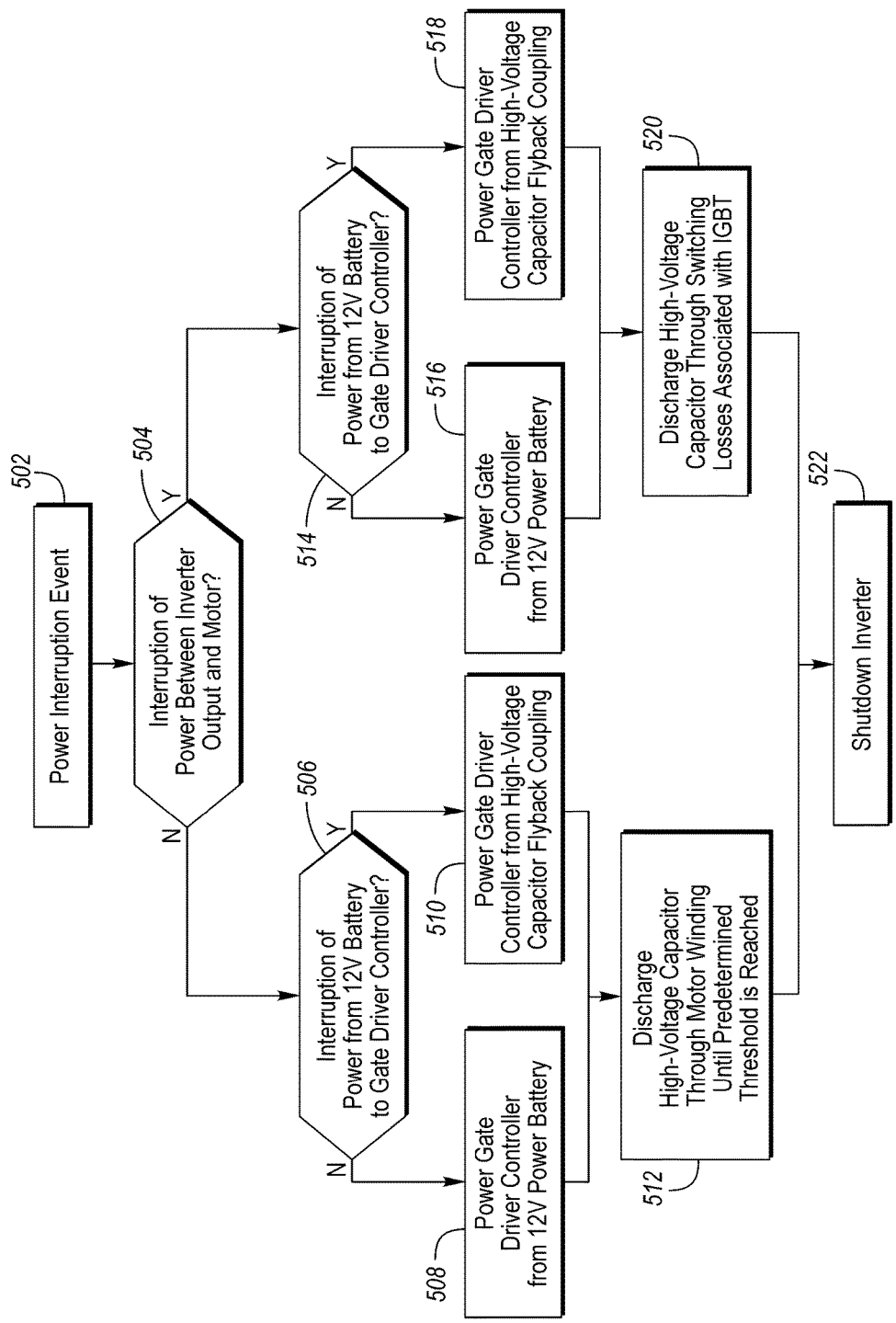
FIG. 5 is a flow diagram depicting controller response to a power interruption event.

Now referring to FIG. 5, a flow diagram 500 is shown with start 502. The flow diagram 500 shown having the first determination step 504. Step 504 may be interchangeable with step 506 and step 514. Meaning, the controller may be configured to respond to either an interruption of the 12-volt power supply or interruption of the power between the inverter and the motor first. The controller may also be configured with each determination step 504, 506, 514 as case statements.

In step 502, a power interruption event occurs. A power interruption event may occur when any of the inverter devices lose connection to a power source. In step 504, if an interruption of power between the inverter output and motor has not occurred, the controller moves to step 506. In step 506, the controller determines whether an interruption of power from the 12-volt battery to the gate driver controller. In step 508, if interruption has not occurred, the gate driver controller will receive power from the 12-volt battery and discharge the capacitor through the motor winding until the predetermined threshold is reached in step 512. In step 510, if interruption has occurred, the gate driver controller will receive power from the flyback coupling and discharge the capacitor through the motor winding until the predetermined threshold is reached in step 512. In step 522, the inverter and gates are shutdown.

Referring back to step 504, if an interruption of power between the inverter output and motor has occurred, the controller moves to step 514. In step 514, the controller determines whether an interruption of power from the 12-volt battery to the gate driver controller exists. In step 516, if interruption has not occurred, the gate driver controller will receive power from the 12-volt battery and discharge the capacitor through the motor winding until the predetermined threshold is reached in step 512. In step 518, if interruption has occurred, the gate driver controller will receive power from the flyback coupling and discharge the capacitor through the motor winding until the predetermined threshold is reached in step 520. In step 522, the inverter and gates are shutdown.

The words used in the specification are words of description rather than limitation, and it is understood that various changes may be made without departing from the spirit and scope of the disclosure. As previously described, the features of various embodiments may be combined to form further embodiments of the invention that may not be explicitly described or illustrated. While various embodiments could have been described as providing advantages or being preferred over other embodiments or prior art implementations with respect to one or more desired characteristics, those of ordinary skill in the art recognize that one or more features or characteristics may be compromised to achieve desired overall system attributes, which depend on the specific application and implementation. These attributes may include, but are not limited to cost, strength, durability, life cycle cost, marketability, appearance, packaging, size, serviceability, weight, manufacturability, ease of assembly, etc. As such, embodiments described as less desirable than other embodiments or prior art implementations with respect to one or more characteristics are not outside the scope of the disclosure and may be desirable for particular applications.

What is claimed is:

1. A vehicle power system comprising:
a motor; and
a controller programmed to, in response to interruption of power to a gate driver of an inverter, continue switching electronic switches of the inverter to discharge stored energy from a high-voltage capacitor of the inverter, that is electromagnetically coupled via a coupling to rails and a gate driver of the inverter, such that losses associated with the motor dissipate the stored energy.

2. The system of claim 1, wherein the coupling includes a flyback converter.

3. The system of claim 2, wherein the flyback converter provides galvanic isolation between the high-voltage capacitor and the gate driver.

4. The system of claim 1, wherein the coupling is a backup power supply to a gate driver control board.

5. The system of claim 1, wherein the controller is further programmed to continue switching the electronic switches until a voltage of the stored energy is dissipated below 60 volts.

6. The system of claim 1, wherein the controller is further programmed to increase a switching frequency of the electronic switches faster than the switching frequency of the electronic switches when interruption occurs.

7. The system of claim 6, wherein the switching frequency is a maximum switching frequency of the electronic switches.

* * * * *